United States Patent [19]

Swoboda

[11] Patent Number: 5,937,179
[45] Date of Patent: Aug. 10, 1999

[54] INTEGRATED CIRCUIT DESIGN SYSTEM WITH SHARED HARDWARE ACCELERATOR AND PROCESSES OF DESIGNING INTEGRATED CIRCUITS

[75] Inventor: Gary L. Swoboda, Sugarland, Tex.

[73] Assignee: Texas Instruments Incorporated, Dallas, Tex.

[21] Appl. No.: 08/762,172

[22] Filed: Dec. 9, 1996

Related U.S. Application Data

[60] Provisional application No. 60/008,639, Dec. 14, 1995.

[51] Int. Cl.⁶ .............................. G06F 17/50; G06F 9/455
[52] U.S. Cl. .......................... 395/500; 364/489; 364/490; 364/578; 395/183.04
[58] Field of Search ..................................... 364/488, 489, 364/490, 578; 395/500, 311, 183.04

[56] References Cited

U.S. PATENT DOCUMENTS 5,146,460   9/1992   Ackerman et al. ...................... 364/488
5,329,471   7/1994   Swoboda et al. ........................ 364/578

OTHER PUBLICATIONS

Runyon, Stan, Designers Take Over Test, Electronic Engineering Times, Jul. 6, 1992, pp. 42–43.

Primary Examiner—Kevin J. Teska
Assistant Examiner—Thai Phan
Attorney, Agent, or Firm—Gerald E. Laws; Robert D. Marshall, Jr.; Richard L. Donaldson

[57] ABSTRACT

An interactive environment is provided for integrated circuit (IC) designers to do an emulation session on a hardware accelerator 111 and then move to simulator 131, and vice versa. An aspect of the present inventive solution swaps memory state and logic storage node state (such as flip-flops and latches) between the accelerator 111 and simulator 131. A complete context switch is performed to create a time shared environment on hardware accelerator 111 so that multiple IC designers can access and use the accelerator. Multiple memory pages can be incorporated to minimize state swap time. Multiple accelerators 111 can be interconnected with a plurality of simulators 131 and a plurality of workstations 101 to allow multiple designers to do interactive operations and allows shifting back and forth between hardware emulation and software simulation.

16 Claims, 6 Drawing Sheets

INTEGRATED CIRCUIT DESIGN SYSTEM WITH SHARED HARDWARE ACCELERATOR AND PROCESSES OF DESIGNING INTEGRATED CIRCUITS

This application claims the benefit of U.S. Provisional Application No. 60/008,639, filed on Dec. 14, 1995.

FIELD OF THE INVENTION

This invention is in the field of semiconductor integrated circuit design, and relates primarily to simulation and emulation of circuit designs.

BACKGROUND OF THE INVENTION

Slowness of design process for integrated circuits (IC) reduces time to market, and can be a competitive disadvantage if other companies find faster processes.

In the past, an IC design process describes the IC logic in Very high speed IC Hardware Description Language (VHDL) or some other type of hardware description language, feeds VHDL into a simulation environment, and loads a netlist which describes the interconnection topology of the design into a hardware accelerator. The hardware accelerator typically is a chassis full of software programmable Field Programmable Gate Arrays (FPGAs). Software evaluates the netlist and partitions it so that the FPGAs can be programmed to emulate the topology of the proposed design. The designer then interacts with the hardware accelerator to emulate and evaluate the operation of the proposed IC design.

Typically, the IC design process is oriented towards a batch mode or single-user interactive mode. Such a single user environment restricts access to the hardware accelerator to a single designer, which hampers the design process.

Accordingly, it is an object of the invention to provide an IC design system which allows the designer to interact with the simulation environment and make more effective use of the hardware accelerator.

Another object of the invention is to allow multiple designers to interact with the simulation environment in order to reduce the design cycle time.

Other objects and advantages will be apparent to those of ordinary skill in the art after referring to the following figures and specification.

SUMMARY OF THE INVENTION

In accordance with the present invention, a design system for designing and simulating integrated circuits is provided which comprises a hardware accelerator having programmable gate array circuitry for emulating an integrated circuit design, a software simulator for simulating an integrated circuit, and an interface circuit for transferring an emulation state representing the integrated circuit between the accelerator and the simulator.

In another aspect of the present invention, an integrated circuit design system is provided which comprises a computer which is operative to provide digital information which represents a netlist of an integrated circuit design, in which the integrated circuit design has at least one scan register for accessing state information, a hardware accelerator for emulating the integrated circuit design has programmable gate array circuitry and is responsive to the netlist to program the gate array circuitry to provide the scan register and to connect the scan register to a serial output, an interface which is coupled to the serial output operates to provide an interface output, and a simulator which is coupled to the interface output to process the emulation state information from the scan register in combination with the netlist information for software simulation of an integrated circuit represented by the netlist.

The present invention may also comprise a memory coupled to the programmable gate array circuitry for holding a plurality of test vectors and emulation data and means for addressing the memory such that a plurality of pages is formed.

Another aspect of the present invention is a process for manufacturing an integrated circuit which comprises the steps of:

a. creating netlist information which is representative of a netlist of the integrated circuit, b. creating a sequence of test vectors for testing the netlist, c. forming an emulation of the integrated circuit by loading the digital netlist information and the test vector sequence into a hardware accelerator, d. forming a simulation of the integrated circuit by loading the netlist information and test vector sequence into a software simulator, e. simulating the operation of the integrated circuit on the software simulator for a period of time using the test vectors and then stopping the simulation at a first simulation state, f. transferring a state context information representative of the first simulation state of the simulated integrated from the software simulator to the hardware emulator, g. emulating the operation of the integrated circuit on the hardware accelerator for a period of time such that the emulation begins with the integrated circuit in a first emulation state which is the same as the first simulation state, h. transferring a second state context information representative of a second emulation state at the end of emulation period back to the software simulator, and i. simulating the operation of the integrated circuit for a second simulation period on the software emulator such that the second simulation begins with the simulated integrated circuit in a second simulation state which is the same as the second emulation state.

The steps of emulating the integrated circuit on the hardware accelerator may further comprise time slicing the emulation of the operation of the integrated circuit in such a manner that a plurality of simulation sessions can proceed simultaneously.

Another aspect of the present invention is that software can be developed in a similar fashion using an accelerator having a target processor for executing prototype software.

BRIEF DESCRIPTION OF THE DRAWINGS

Other features and advantages of the present invention will become apparent by reference to the following detailed description when considered in conjunction with the accompanying drawings, in which.

Prior art

Prior art

Prior art

Corresponding numerals and other corresponding symbols refer in the different figures and tables refer to corresponding parts unless otherwise indicated.

DETAILED DESCRIPTION OF PREFERRED EMBODIMENTS OF THE INVENTION

Figure 4:
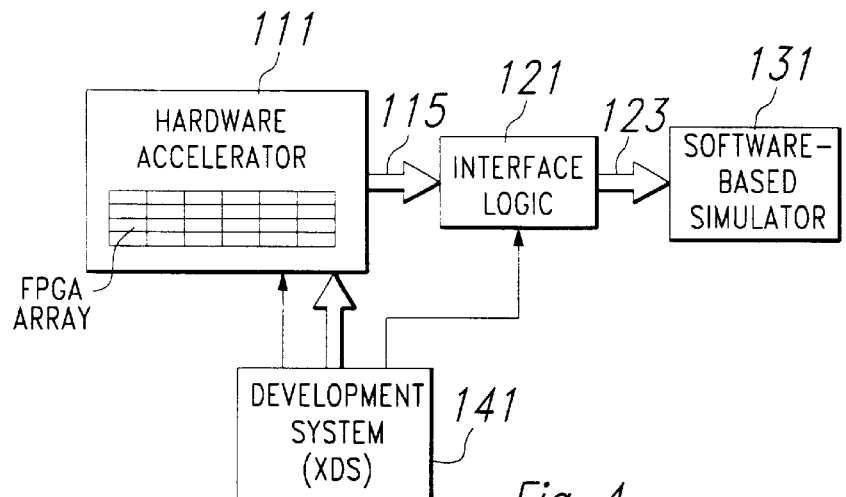
FIG. 4 is a block diagram of a design system according to the present invention having an accelerator, simulator and interface joining them.

FIG. 4 illustrates an interactive environment for integrated circuit (IC) designers to do an emulation session on the hardware accelerator 111 and then move to simulator 131, and vice versa. An aspect of the present inventive solution swaps memory state and logic storage node state (such as flip-flops and latches) between the accelerator 111 and simulator 131. A complete context switch is performed to create a time shared environment on the hardware accelerator so that multiple IC designers can access it. As further illustrated in FIG. 6, this opens up hardware accelerator 111, or multiple accelerators 111A–111B, to multiple designers doing interactive operations and allows shifting back and forth between hardware emulation and software simulation to resolve problems in an expedient manner.

Figure 1:
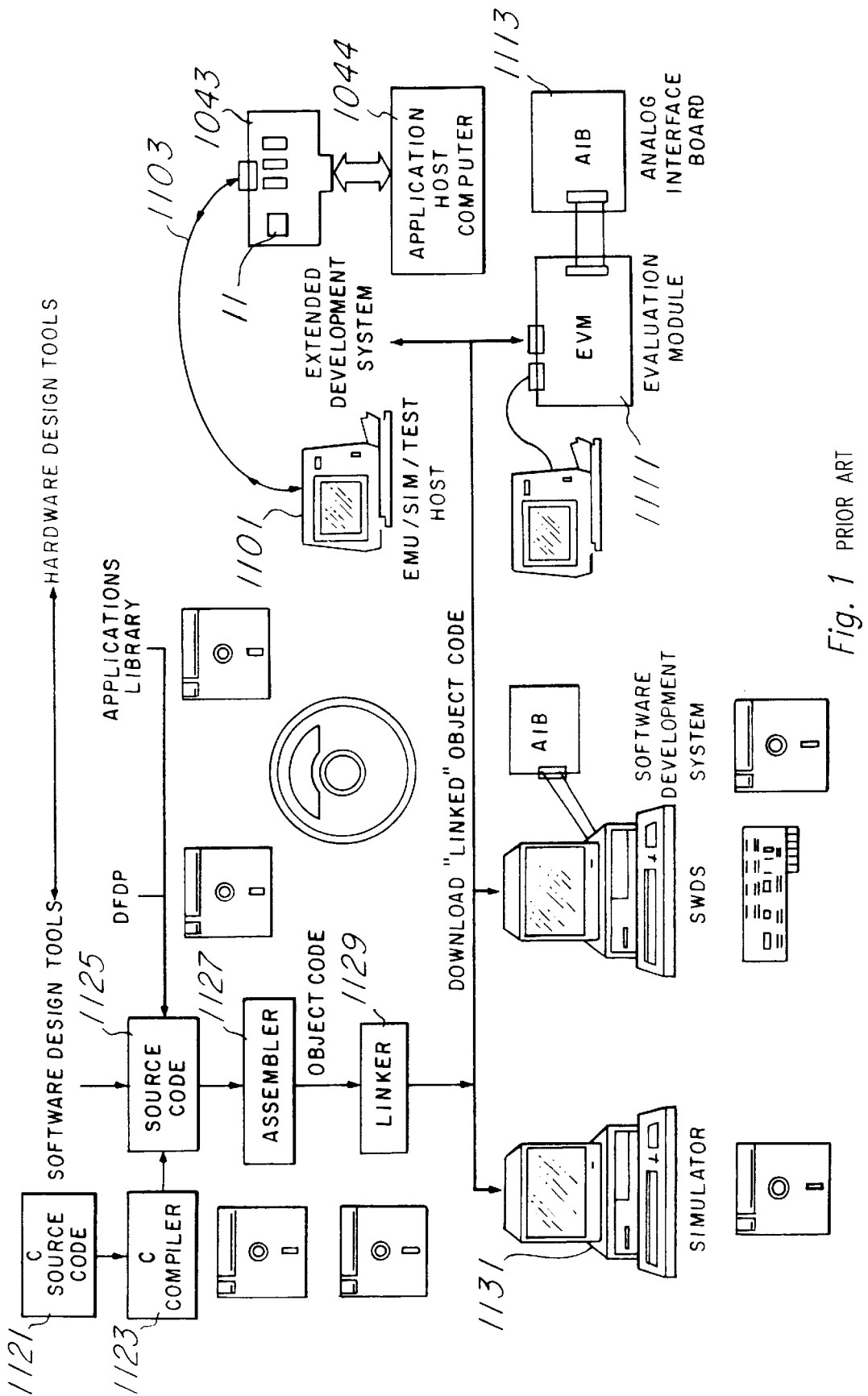
FIG. 1 is pictorial block diagram of a design system according to the present invention for developing integrated circuit chips and software.
Figure 2:
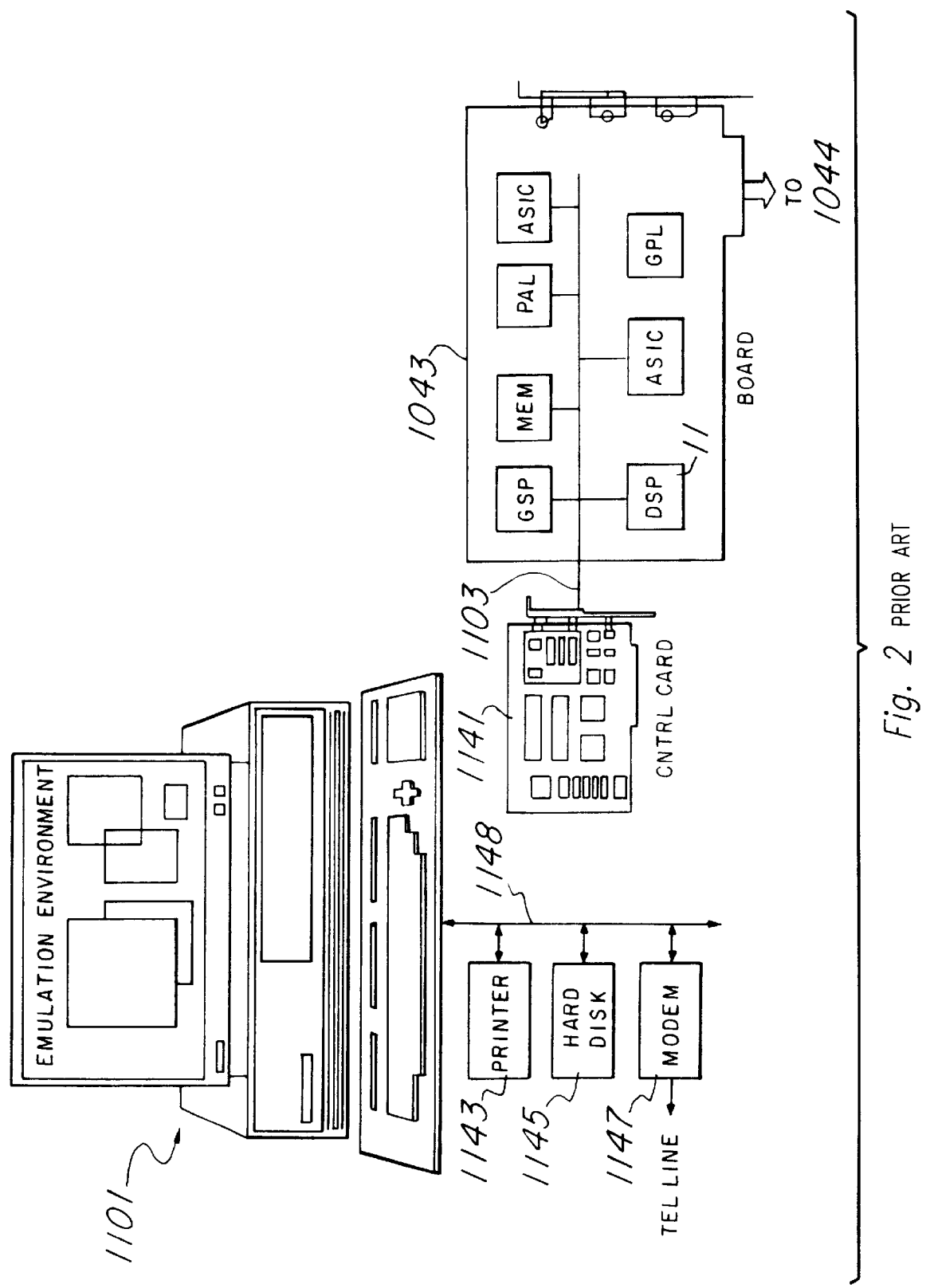
FIG. 2 is a pictorial block diagram of a system configuration for emulation, simulation, testability and attached processor data processing, communications I/O and peripheral access.
Figure 3:
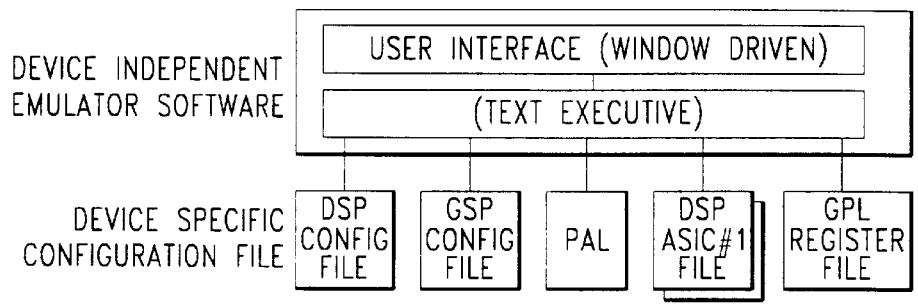
FIG. 3 is a diagram of a software configuration for a host computer of FIG. 2.

In a previous commonly assigned U.S. Pat. No. 5,329,471, which is incorporated herein by reference, a description and illustrations of development tools were shown. FIGS. 1–3 of the present description are reproduced FIGS. 44–46 of U.S. Pat. No. 5,329,471. Simulator 1131 of FIGS. 1–2 corresponds to simulator 131 of the FIGS. 4–6. Workstation or other computer 1101 of FIGS. 1–2 corresponds to workstation 101 of FIGS. 5 and 6. The controller card 1141 of FIGS. 1–2 corresponds to development system 141 of FIG. 5 and 6. The emulation software configuration of FIG. 3 corresponds to the software in development system 141 that downloads a netlist to the hardware accelerator 111. At this point, the differences and improvements provided by the invention of FIGS. 4–6 become apparent wherein the hardware accelerator 111 is added, together with coupling to simulator 131, such as by the special coupling interface 121.

Returning to FIG. 4, a hardware accelerator 111 has a Field Programmable Gate Array (FPGA) operated with a 1 MHz. clock. The accelerator is loaded with a netlist from development system 141, a Texas Instruments XDS 510 for example. A netlist is a commonly used ordered set of data for describing an integrated circuit design which defines logic modules and a topological interconnection between the logic modules. Accelerator 111 emulates the integrated circuit design by evaluating the net list and mapping each logic element defined by the net list onto a corresponding logic element in the FPGA array. Interconnects are then programmed into the FPGA array according to the netlist. According to the present invention, one or more scan registers are included in the netlist to access and change the state of each logic element of the circuit design which functions as a storage node. Each scan register is respectively connected to a corresponding line in a bus 115. Bus 115 is connected to interface logic 121 which converts bus 115 to serial line 123. Serial line 123 shifts out the data on one serial line to a software-based simulator computer 131. Simulator 131 uses VHDL to describe the integrated circuit design which is being simulated, but other types of hardware design languages may be used in conjunction with the present invention.

An aspect of the present invention is that the state of all logic storage nodes, such as flip-flops and latches, used in the integrated circuit design which is being emulated in accelerator 111 can be quickly accessed and changed by means of the various scan registers. A netlist can be loaded onto the emulator and then all of the storage nodes of the circuit design can be initialized with state information via the scan registers. An emulation can then be performed for a period of time, such as some number of emulated cycles or until an error condition is detected, for example.

At the completion of the emulation period, the state of the circuit can be transferred, as described later, to a software simulator for further design analysis. Once the logic state of all the storage nodes are determined by means of the scan registers, the software simulation environment can be preset to match the last state of the hardware emulation by mapping the states into the VHDL representation of the simulated circuit design. Likewise, the state of each storage element can be extracted from the software simulator by examining the VHDL representation at the end of a simulation session. The hardware emulation environment can then be preset to match the last state of the software simulation by loading the extracted state information into the emulated logic storage nodes by means of the various scan registers.

Thus, evaluation and debugging of the integrated circuit can be carried out in an intermingled manner on both a hardware emulator and a software simulator. This advantageously allows the best features of each environment to be used as needed. For example, a design can be simulated, which is inherently relatively slow, for a few cycles to verify that it is operational. Then the state can be transferred to the emulator and high speed emulation can proceed until an error condition is detected. Then the state can be transferred back to the simulator and stepped forward or backward in order to determine the cause of the error. At this point, emulation and simulation can continue in order to uncover other errors, or the design can be corrected and a new netlist can then be loaded on the emulator and simulator.

Since a complete context switch of the state of the circuit design (referred to as state context) is performed, a time shared environment can be created on the hardware accelerator so that multiple users can access it. This opens up hardware accelerator 111 to multiple users doing interactive operations in which each user can independently shift back and forth between hardware emulation and software simulation to examine various aspects of the circuit design. The number of users which can use hardware accelerator 111 in a time shared manner is limited by the rate at which a state context can be transferred between hardware accelerator 111 and simulator 131.

Figure 5A:
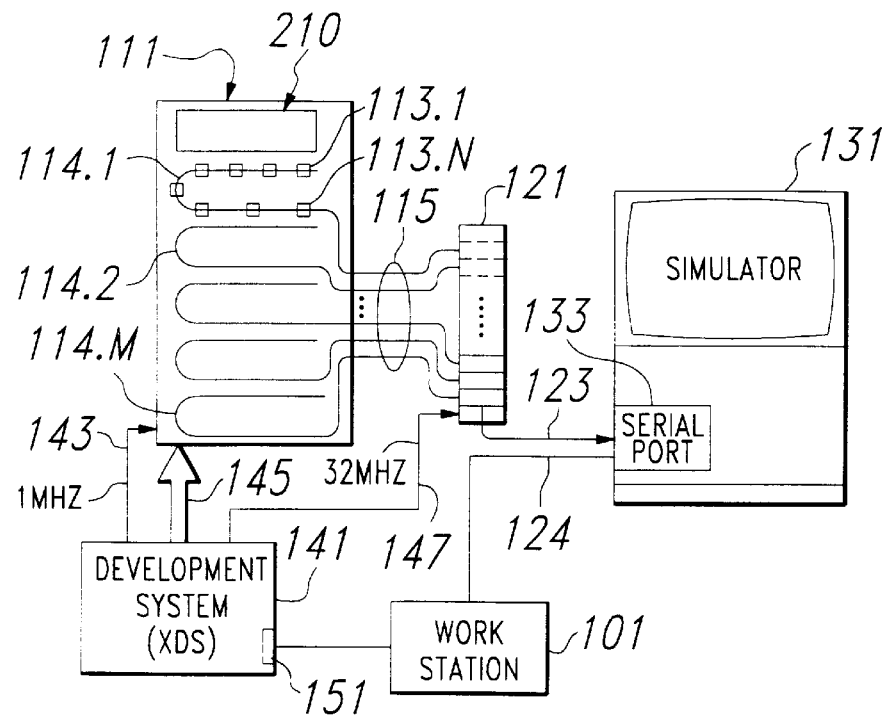
FIG. 5A–B is a block diagram of the design system of FIG. 4, showing the accelerator in more detail.

FIG. 5A illustrates the system of FIG. 4 in more detail. At least one scan register 114 is included in the circuit design to access all storage nodes. A scan register comprises a series of synchronously clocked master/slave latches (scan register latch, SRL), each of which is connected to a particular storage node in the logic circuit. These SRL's can be loaded with a serial data stream (scan in) and can present their contents to the nodes in the logic circuit, presetting the logic circuit nodes to a predetermined state. Likewise, the contents of each SRL can be read by serially unloading (scan out) the scan register. If the circuit design does not include scan registers for other reasons, then a flip-flop 113 with a scan register latch and an input mux may be substituted as a flip-flop macro to make the design scanable for purposes of emulation. Typically, clock 143 operates at 1 MHz and is used to clock the scan register, however, other clock frequencies may be used. Thus, scanable circuitry is established in accelerator 111 and allows scanning of all internal nodes. With a single scan register, interface circuit 121 may not be required if bus 115 is compatible with serial line 123. However, at 1 MHz on clock line 143, swapping state between units 111 and 131 takes 10 milliseconds assuming 10,000 nodes in accelerator 111. This limits state context swapping to perhaps 100 swaps per second.

An alternative embodiment creates a plurality of small scan loops (FIG. 5A) which each operate at 1 MHz. Each of the small scan loops 114.1, 114.2, . . . 114.M in accelerator 111 are connected to one line in bus 115. Bus 115 may have any number of lines, 32 for example. Interface logic 121 acts like a 32 bit shift register into which scan registers 114 are clocked in parallel at 1 MHz and clocked out serially in response to a 32 MHz. clock on line 147. The thus-combined data is shifted on one serial line to software-based simulator computer 131. Interface 121 thus provides an outer scan loop at a 32 MHz scan rate onto serial line 123. In the example of 10,000 nodes, each scan loop 114 has about 1/32 of the number of nodes, and can load the shift register 121 in only about 300 microseconds for a swap rate (throughput to simulator 131) of about 3000 swaps per second. Bus 115 may have a different number of lines, and clock 147 may operate at other frequencies.

Figure 5B:
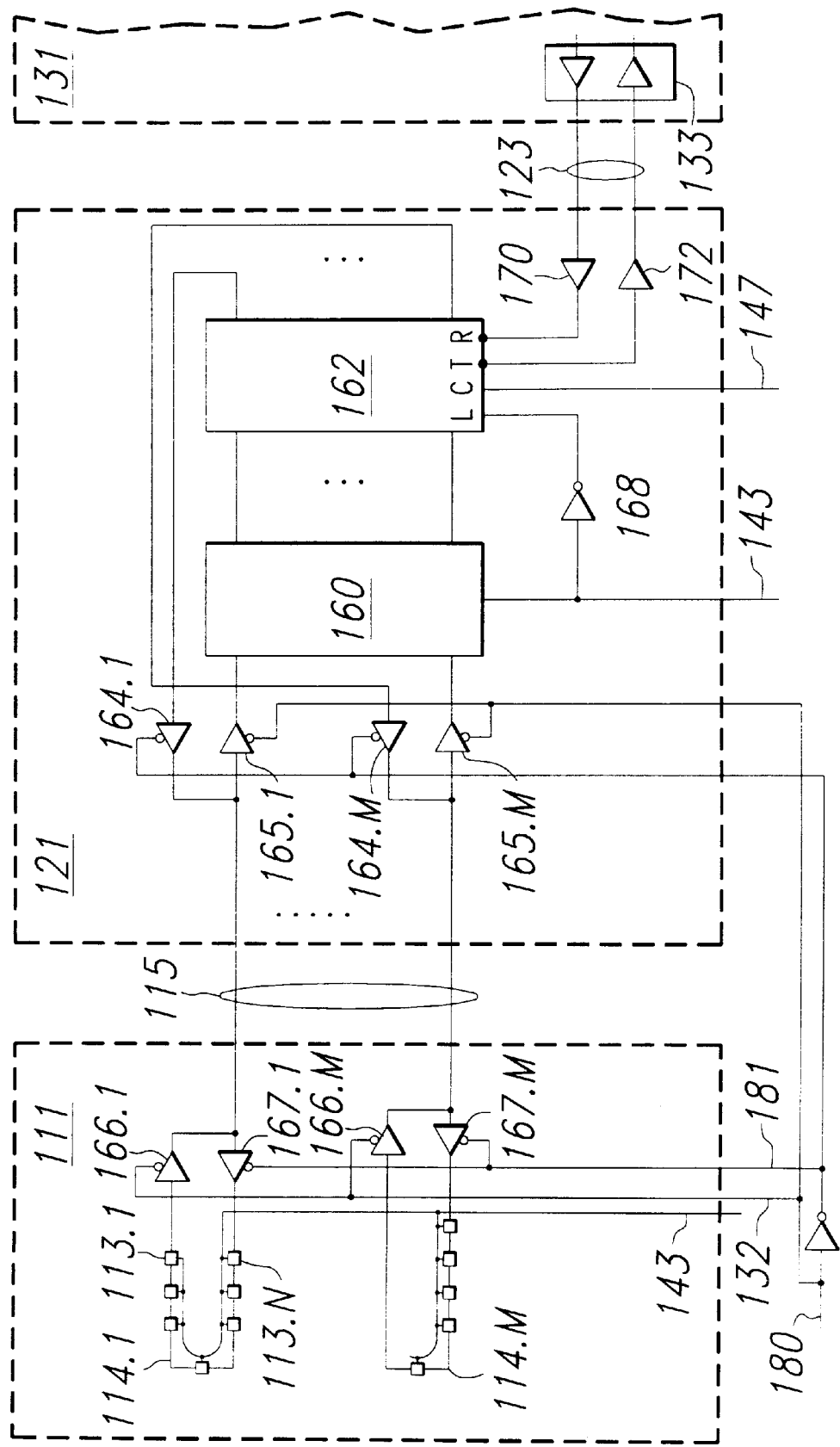

FIG. 5B is a block diagram illustrating interface 121 in more detail. State data may be either uploaded from accelerator 111 to simulator 131 or downloaded from simulator 131 to accelerator 111. Direction control line 180 controls the direction of transfer on bus 115. When data is to be uploaded, control line 180 is held low to enable drivers 166 and receivers 165. Register 160 is clocked on the rising edge of 1 MHz clock 143 to capture one bit of data from each scan loop 114, thus forming a 32 bit word of upload data. Each flip-flop 113 of each scan loop 114 is also clocked by clock 143 in order to sequentially shift the contents of the entire scan register to the input of register 160 and thereby form a word of data corresponding to the contents of each flip-flop 113 in a bit position corresponding to each scan register 114. Each word of upload data is then presented to shift register 162 which is loaded on the falling edge of the 1 MHz clock. Shift register 162 may be a commonly known Asynchronous Receiver/Transmitter, for example. Register 160 is typically 32 bits wide, but can be any number of bits to match the number of scan registers. Multiplexing circuitry may be required to match the width of register 160 to the width of shift register 162.

The upload data which is loaded into shift register 162 is then shifted out serially by 32 MHz clock 147 from transmit terminal T. Buffer 172 sends the serial data stream onto bus 123.

When state data is to be downloaded from simulator 131 to accelerator 111, control signal 180 is held high to enable drivers 164 and receivers 167. Serial data is received into shift register 162 from bus 123 via receiver 170 and receive terminal R. Shift register 162 is again clocked by 32 MHz clock 147 to form a word of download data on the output of register 162. Each word of download data is presented to scan loops 114 in a bit-wise manner and the scan loops are clocked with clock 143 to sequentially load each flip-flop 113.

The interface 121 may be formed in an Application Specific Integrated Circuit (ASIC) and controlled by clocks on lines 143 and 147. In another embodiment, a microprocessor such as a digital signal processor (DSP) or other microprocessor or microcomputer is substituted for the ASIC to provide the interface 121. The DSP reads scan loops 114 in parallel and then shifts the resultant data bits out in serial on line 123, supplying them at a clock multiple rate into serial port 133 of simulator 131. Alternatively, line 123 could also be a parallel bus of any number of lines, 16 for example. The direction of data transfer of interface 121 is controlled by development system 141.

Figure 6:
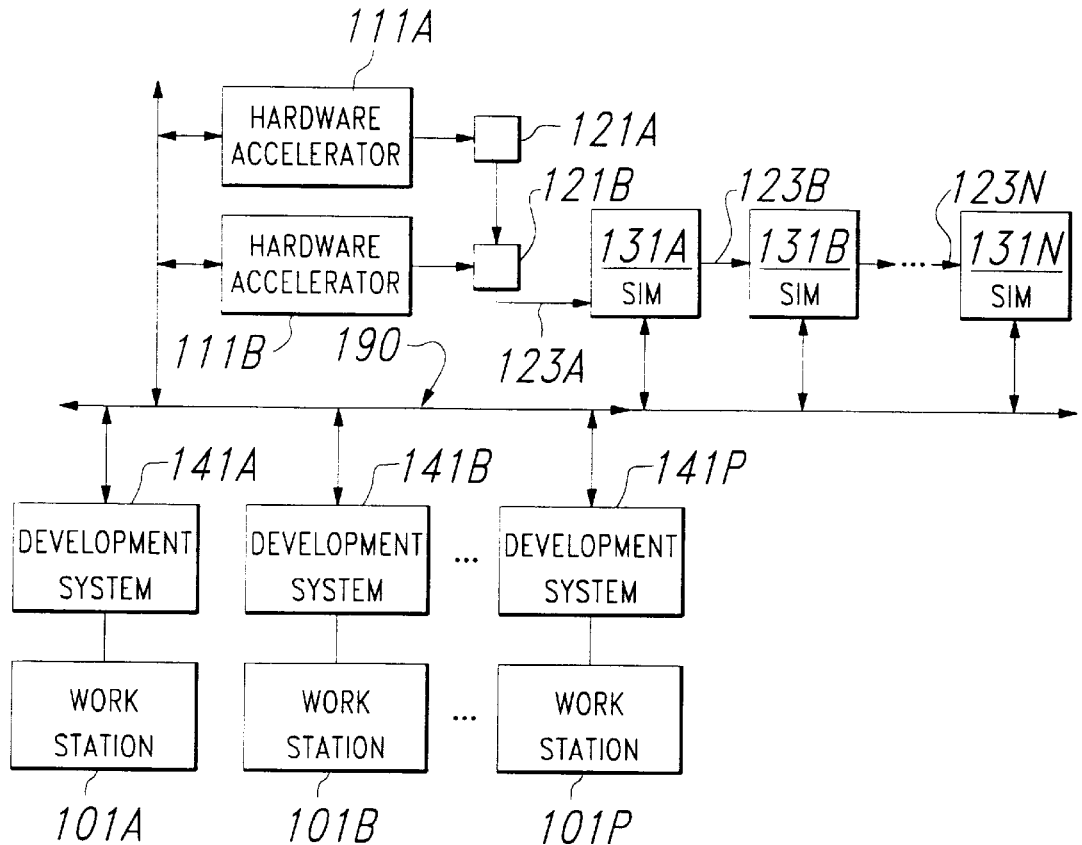
FIG. 6 is a block diagram showing an expanded design system according to the present invention having multiple accelerators and multiple simulators.

In FIG. 6, multiple development systems 141A, 141B, . . . 141P associated with work stations 101A, 101B, . . . 110P share access to a hardware accelerators 111A and simulators 13A, 131B, . . . 131N via a development bus 190. A token ring or Ethernet local area network LAN system can alternatively be provided for the communications highway represented by bus 190. Hardware accelerator 111A supplies multiple scan register outputs in parallel to interface 121A for high speed swaps to the serial ports of simulators 131A, 131B, . . . 131N. A second hardware accelerator 111B and interface 121B analogous to accelerator 111A and interface 121A can also be introduced into the system for further productivity enhancements. Interfaces 121A and 121B are provided in series in the same scan register 123 as shown, or can provide distinct parallel outputs to subsets of the simulators 131A, 131B, . . . 131N. Additional hardware accelerators may be added in like manner.

Figure 7A:
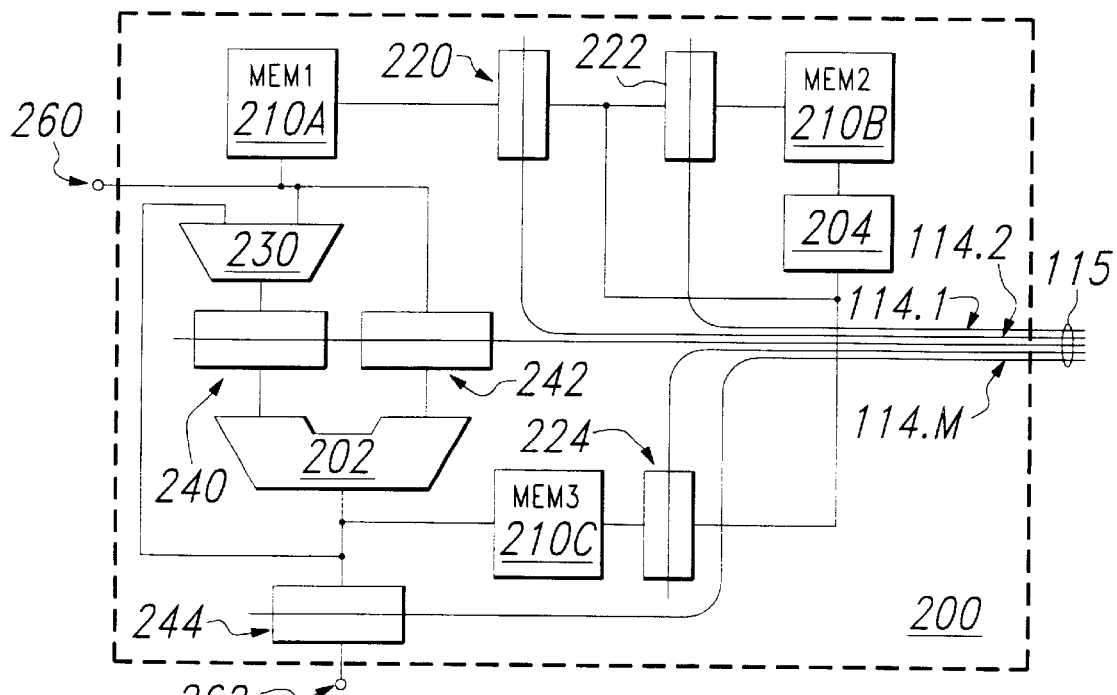
FIG. 7A–B is a block diagram of a typical IC design which is being emulated according to the present invention using memory modules provided by the accelerator and addressing means for creating multiple pages within the memory modules.
Figure 7B:
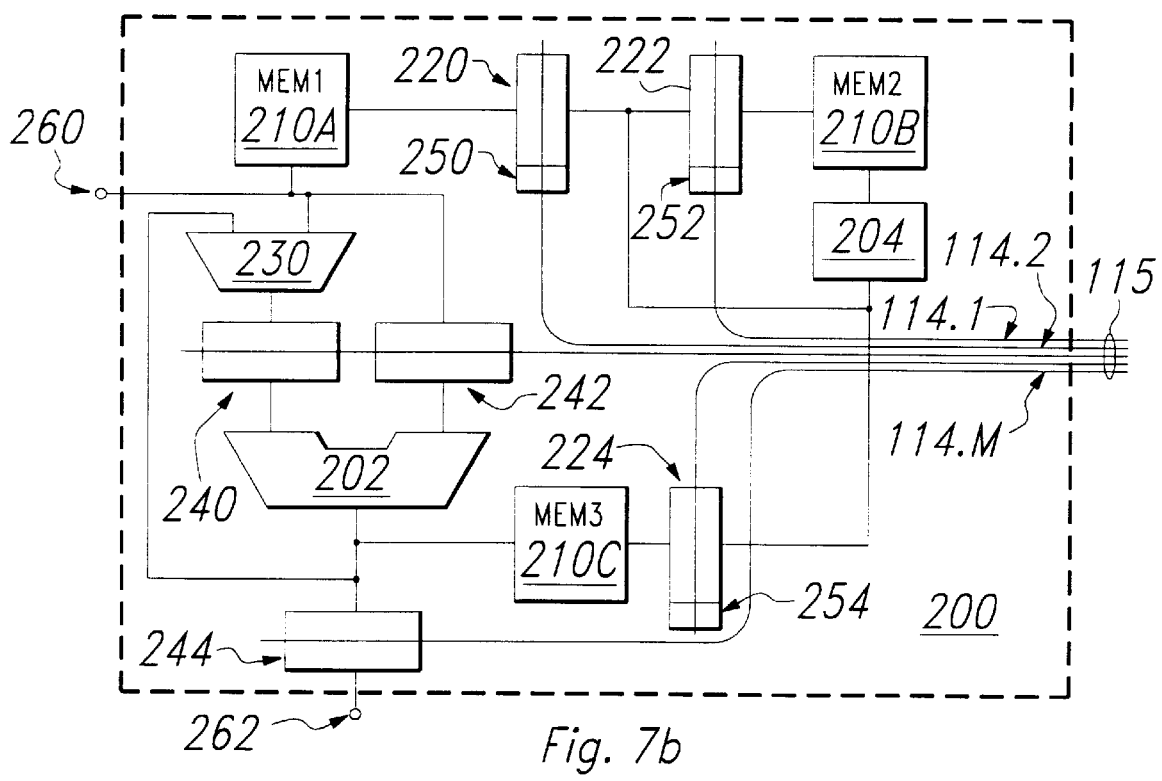

FIG. 7A–7B illustrate a typical integrated circuit design 200 which may be emulated/simulated according to the present invention. Memory blocks 210A–210C are included in the integrated circuit design and are emulated by the hardware accelerator. Address registers 220, 222, and 224 hold an address for each memory block and are each included in a scan register 114. The memory blocks themselves may or may not be included in a scan register. Swapping the contents of small blocks of memory is reasonable; however, larger blocks of memory will significantly increase the swapping time. The memory blocks may be actual blocks of memory that are included in the hardware accelerator and interconnect with the FPGA array to emulate the circuit design. Multiple blocks of memory may be provided by accelerator 111, such as blocks 210A–210C. The accelerator may provide a parallel bus to access and swap the contents of the memory blocks and a parallel interface may be provided between the accelerator and the software simulator 131 in order to reduce the swap time.

In FIG. 7B, memory is provided with pages for a plurality of emulation sessions. Page registers 250, 252, and 254 provide a means for each emulation session to address a page of memory which is reserved for that emulation session. The mapping registers are included in scan registers. Different sessions use different pages. This feature of the present invention advantageously eliminates the need to reload the memory during each swap. Only the page register need be changed via the scan register to point to the appropriate page for a given emulation session. Each page register holds some number of bits of the most significant portion of the address. For example, a three bit register would support eight pages and therefore allow eight separate emulation sessions without swapping memory contents. Other known means of page mapping can be used, such as a latch in combination with an adder to allow variable page sizes.

Memory blocks may store instructions of a program, if the circuit design is for a digital processor. The program is "executed" by the emulated processor in order to debug the processor design. For a non-processor design, the memory blocks could store test vectors which are connected to the inputs of the circuit design and thereby used to test the operation of the circuit. In either manner of use, reducing swap time by means of paging is advantageous.

Since the state image of the IC logic established in the hardware accelerator 111 is a set of bits representing each of many flip-flops 113, using synthesis, the logic designer is not as apt to program the gates in the FPGAs of accelerator 111. The real debug information is in the flip-flop states. By copying the scan image out of the hardware accelerator 111 into software simulator 131, the simulation environment, similar to that illustrated in FIG. 3, can display the states of an array which is uploaded from the hardware accelerator. The design is just an array of flip-flops 113. Their state is copied from hardware accelerator 111 to the software tools of the simulation environment in simulator 131. The simulator 131 can then commence simulation from the state which has been transferred from accelerator 111 without regard to the sequence of events which produced the state which was transferred. In accordance with the present invention, the hardware accelerator state is rapidly loaded into the simulation environment by memory copies (memory copying operations). If there is a failure event in the emulated operation of the IC design, then a state representing the failure event is immediately, or within a neighboring few clock cycles of the failure event, transferred into the software simulator and the simulator 131 runs efficiently from there. Thus, operations of checkpoint and save state and load state are provided.

The integrated circuit designs to which the benefits of the present invention are applicable are widely varied. For example, various types of digital processors, such as a digital signal processor, a graphics processor, a floating point processor, or a general purpose processor may be emulated and simulated during the circuit design phase. Furthermore, programs may be developed for such processors using the beneficial features of the present invention. Other types of circuit designs which may benefit from the present invention include, but are not limited to, ASIC's, core logic for an ASIC, macro cell designs, etc.

While the present invention has been described in regards to assisting in the design and development of an integrated circuit, many other types of design efforts can benefit from the present invention, such as analog or digital designs, multiple chip designs, mechanical designs, and system designs, for example.

Another advantage of the present invention is that it does not matter if software simulation is slow if only a few cycles need to be simulated to get to the failure. According to the present invention, the simulation state can be moved from a hardware accelerator in response to an failure detection to a software simulator unbeknownst to end user. Alternatively, the user may be informed of the failure on the hardware accelerator and then initiate a state transfer at the press of a button.

Another advantage of the present invention is that a complete context switch can be performed to create a time shared environment for multiple user access to the hardware accelerator.

Another advantage of the present invention is that it opens up a hardware accelerator to multiple users doing interactive operations in a manner that allows each user to shift back and forth between hardware emulation and software simulation to discover and eliminate problems in the IC design.

As used herein, the terms "applied," "connected," and "connection" mean electrically connected, including where additional elements may be in the electrical connection path. While the invention has been described with reference to illustrative embodiments, this description is not intended to be construed in a limiting sense. Various other embodiments of the invention will be apparent to persons skilled in the art upon reference to this description. It is therefore contemplated that the appended claims will cover any such modifications of the embodiments as fall within the true scope and spirit of the invention.

What is claimed is:

1. An integrated circuit design system comprising:

a computer operative to provide digital information representative of a netlist of an integrated circuit design, said integrated circuit design having a plurality of logic storage nodes and at least one scan register for holding state context information therein;

a hardware accelerator for emulating said integrated circuit design having a serial output operative at a first scan clock rate, said accelerator having programmable gate array circuitry and responsive to said digital information to program said gate array circuitry to emulate said plurality of storage nodes and said scan register and to connect said scan register to said serial output;

an interface circuit coupled to said serial output, said interface circuit operative to serially provide an interface circuit output; and a simulator coupled to said interface circuit output to process said state context information from said scan register of said hardware accelerator in combination with said digital information for software simulation of an integrated circuit represented by said netlist, wherein said state context represents a state of said plurality of logic storage nodes.

2. The design system of claim 1 further comprising:

a plurality of scan registers defined by said netlist, each operative to serially transfer a portion of said state context information from said scan registers between said accelerator and said interface circuit; and wherein said interface circuit is connected to said plurality of scan registers, said interface circuit being operative at a second clock rate to serially provide an interface circuit output.

3. The design system of claim 2 wherein said second clock rate is 32 times faster than said first scan clock rate.

4. The design system of claim 1 further comprising:

a memory coupled to said programmable gate array circuitry for holding a plurality of test vectors and emulation data; and means for addressing said memory such that a plurality of pages is formed.

5. The design system of claim 4 which said means for addressing is an address register and a page register.

6. The design system of claim 4 in which said means for addressing is an address register and an offset register.

7. A process for manufacturing an integrated circuit comprising the steps of:

creating a netlist which is representative of said integrated circuit, wherein said integrated circuit has a plurality of logic storage nodes;

creating a sequence of test vectors for testing said netlist;

forming an emulation of said integrated circuit by loading said netlist and said test sequence into a hardware accelerator;

programming gate array circuitry within said hardware accelerator in response to said netlist to program said ate array circuitry to emulate said plurality of storage nodes and said scan register and to connect said emulated scan register to an output of said accelerator;

forming a simulation of said integrated circuit by loading said netlist and said test sequence into a software simulator;

simulating the operation of said integrated circuit on said software simulator for a first simulation period of time using said test vectors and then stopping said simulation in a first simulation state;

transferring a first state context information representative of said first simulation state of said simulated integrated circuit from said software simulator to said hardware emulator, wherein said state context represents a first state of said plurality of logic storage nodes; and emulating the operation of said integrated circuit on said hardware accelerator for a first emulation period of time such that said emulation begins with said integrated circuit in a first emulation state which is the same as said first simulation state.

8. The process of claim 7 further comprising:

transferring a second state context information representative of a second emulation state at the end of said first emulation period of said emulated integrated circuit from said hardware emulator to said software simulator, and simulating the operation of said integrated circuit for a second simulation period on said software simulator such that said second simulation begins with said simulated integrated circuit in a second state which is the same as said second emulation state.

9. The process of claim 7 in which:

the step of creating a sequence of test vectors further comprises creating a plurality of test vector sequences;

the step of forming a simulation further comprises creating a plurality of simulations on a plurality of software simulators by loading said netlist and one of said plurality of test vector sequences on each of said plurality of software simulators;

the step of simulating the operation of said integrated circuit on said software simulator further comprises simulating the operation of said integrated circuit simultaneously in at least two of said plurality of simulations; and the step of transferring a first state context further comprises transferring a plurality of first state contexts representative of a plurality of first simulation states corresponding to said plurality of simulation sessions.

10. The process of claim 9 in which the step of emulating said integrated circuit on said hardware accelerator further comprises time slicing said emulation of the operation of said integrated circuit on said hardware accelerator to provide a plurality of emulation sessions respectively related to said plurality of simulation sessions.

11. The process of claim 10 which the step of transferring state context information further comprises transferring at least two of said plurality of first state contexts to said hardware accelerator in a sequential fashion, such that an emulation using a first of said plurality of first state contexts is completed prior to transferring a second of said plurality of first state contexts.

12. The process of claim 10 further comprising the step of providing a memory module within said hardware accelerator to hold said test vectors and other data created during said emulation.

13. The process of claim 10 further comprising the step of providing a page addressing means for addressing a plurality of pages within said memory module, such that each of said plurality of emulation sessions is associated with a different one of said plurality of pages within said memory module.

14. The process of claim 13 in which:

the step of providing a memory further comprises providing a plurality of memory modules; and the step of providing a page addressing means further comprises providing page addressing means for each of said memory modules.

15. The process of claim 7 further comprising:

updating said netlist to form a final design of said integrated circuit to correct and overcome deficiencies in the operation of said integrated circuit determined during said simulation and emulation steps; and fabricating an integrated circuit wafer corresponding to said final design of said integrated circuit.

16. An integrated circuit design system comprising:

a computer operative to provide digital information representative of a netlist of an integrated circuit design, said integrated circuit design having a plurality of logic storage nodes and at least one scan register for holding state context information therein;

a hardware accelerator for emulating said integrated circuit design having a serial output operative at a first scan clock rate, said accelerator having programmable gate array circuitry and responsive to said digital information to program said gate array circuitry to emulate said plurality of storage nodes and said scan register and to connect said scan register to said serial output;

an interface circuit coupled to said serial output, said interface circuit operative to serially provide an interface circuit output;

a simulator coupled to said interface circuit output to process said state context information from said scan register of said hardware accelerator in combination with said digital information for software simulation of an integrated circuit represented by said netlist, wherein said state context represents a state of said plurality of logic storage nodes;

a plurality of scan registers, each operative to serially transfer a portion of said state context information from said scan registers between said accelerator and said interface circuit; and wherein said interface circuit is connected to said plurality of scan registers, said interface circuit being operative at a second clock rate to serially provide an interface circuit output, wherein said second clock rate is 32 times faster than said first scan clock rate.

* * * * *